United States Patent [19]

Mase et al.

[11] Patent Number: 5,016,663
[45] Date of Patent: May 21, 1991

[54] METHOD OF DETERMINING END OF CLEANING OF SEMICONDUCTOR MANUFACTURING APPARATUS

[75] Inventors: Yasukazu Mase, Tokyo; Masahiro Abe, Yokohama; Osamu Hirata, Kawasaki, all of Japan

[73] Assignee: Kabushiki Kaisha Toshiba, Kawasaki, Japan

[21] Appl. No.: 320,643

[22] PCT Filed: Mar. 31, 1988

[86] PCT No.: PCT/JP88/00327

§ 371 Date: Nov. 30, 1988

§ 102(e) Date: Nov. 30, 1988

[87] PCT Pub. No.: WO88/07757

PCT Pub. Date: Oct. 6, 1988

[30] Foreign Application Priority Data

Mar. 31, 1987 [JP] Japan .................. 62-78505

[51] Int. Cl.$^5$ ............. H01L 21/465; H01L 21/66; B08B 7/00
[52] U.S. Cl. ........................ 134/1; 156/626; 156/643; 156/644
[58] Field of Search ............ 156/626, 643, 644; 134/1

[56] References Cited

U.S. PATENT DOCUMENTS 4,207,137  6/1980  Tretola .................. 156/646

FOREIGN PATENT DOCUMENTS 55-34229   9/1980   Japan .
56-19624   2/1981   Japan .
58-79722   5/1983   Japan .
6145825   12/1984   Japan .
2076330   12/1981   United Kingdom .

Primary Examiner—Olik Chaudhuri
Assistant Examiner—Ourmazd S. Ojan
Attorney, Agent, or Firm—Finnegan, Henderson, Farabow, Garrett and Dunner

[57] ABSTRACT

In a method for determining an end of cleaning of a semiconductor manufacturing apparatus according to the invention, when the interior of a semiconductor substrate process chamber of the semiconductor manufacturing apparatus is cleaned by dry etching using plasma discharge, a constant current or voltage is supplied from a high-frequency power source to discharge electrodes during plasma discharge, an impedance between the electrodes or a temperature in the process chamber is monitored, a time point at which the impedance or temperature is abruptly changed is detected, and this time point of detection is determined to be an end of cleaning.

2 Claims, 5 Drawing Sheets

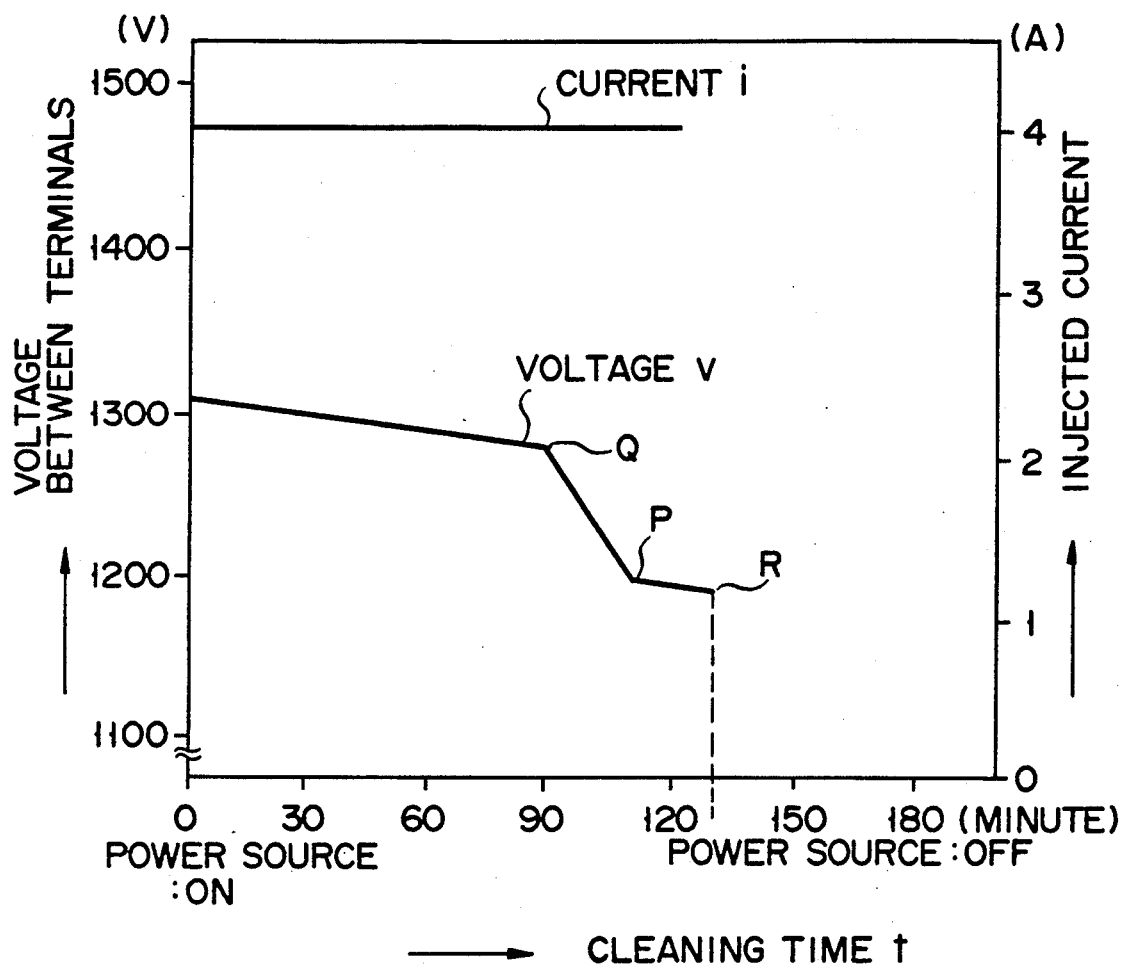
F I G. 2

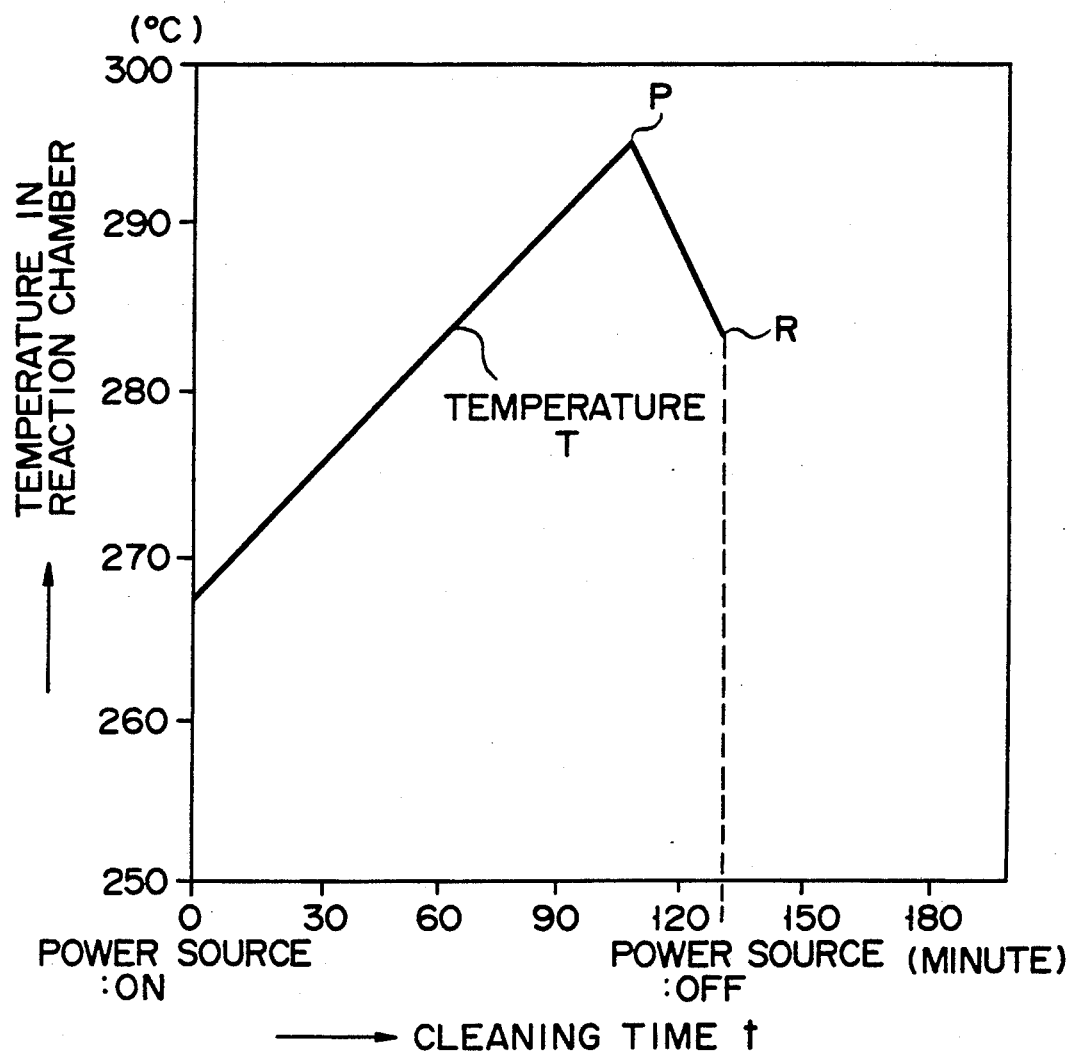
F I G. 5

METHOD OF DETERMINING END OF CLEANING OF SEMICONDUCTOR MANUFACTURING APPARATUS

TECHNICAL FIELD

The present invention relates to a method of determining an end of cleaning of a semiconductor manufacturing apparatus, which is adapted to determine an end of cleaning when the interior of a semiconductor substrate process chamber of a semiconductor manufacturing apparatus is cleaned by dry etching using plasma discharge.

BACKGROUND ART

Mass spectrometry, emission spectroscopy, and the like are known as methods of monitoring and end of cleaning when the interior of a reaction chamber (deposition chamber) of a plasma CVD (chemical vapor deposition) apparatus is cleaned by dry etching using plasma discharge. In addition, Japanese Patent Disclosure (Kokai) No. 61-145825 discloses a power measurement method of detecting an end of cleaning by measuring a reflecting power of a plasma discharge power or a bias voltage generated by a plasma electrode. According to a known time control method, a time for dry etching cleaning is controlled by estimating the total thickness of a film deposited in a reaction chamber from the thickness of a film deposited on a semiconductor substrate and calculating a cleaning time in accordance with the estimated total film thickness.

In the power measurement method, however, since the inductance and capacitance of a matching circuit inserted between a high-frequency power source and a discharge electrode is fixed at the start of cleaning, the inductance may be set in a mismatched state by the end of cleaning, and hence a plasma state becomes unstable. This worsens reproducibility of a cleaning process under the same conditions, and as a result, the time required for cleaning becomes long.

In the time control method, a deposition film thickness in the reaction chamber cannot be accurately measured, and overetching must be performed for a period of time longer than a calculated time by 40% or more in consideration of a variation in estimated total film thickness. For this reason, the operation efficiency of a plasma CVD apparatus is degraded, and the throughput of semiconductor substrates is decreased. In addition, since a carbon contamination layer is formed on an electrode surface during the long overetching operation described above because of the use of an etching gas (normally, a $CF_4/O_2$ gas), the state of the reaction chamber becomes unstable. For this reason, in order to obtain uniformity within ±5% of the thickness of a plasma CVD film on a semiconductor substrate, a deposition process must be frequently performed on a dummy substrate to stabilize the state of the reaction chamber. This operation further decreases the operation efficiency and the throughput.

PROBLEMS TO BE SOLVED BY THE INVENTION

As described above, in the power measurement method, the problems are associated with the fact that the impedance is mismatched during cleaning. The problems posed in the time control method are associated with the fact that the operation efficiency of the semiconductor manufacturing apparatus is decreased.

The present invention has been made in consideration of the above situation, and has as its object to provide a method of determining an end of cleaning of a semiconductor manufacturing apparatus, in which an end of cleaning can be determined with high precision in a real time manner, and the operation efficiency of the semiconductor manufacturing apparatus can be increased by shortening the time required for cleaning.

MEANS FOR SOLVING THE PROBLEMS

According to the present invention, a method of determining an end of cleaning of a semiconductor manufacturing apparatus is characterized in that when the interior of a semiconductor substrate process chamber of the semiconductor manufacturing apparatus is cleaned by dry etching using plasma discharge, an impedance between discharge electrodes or a temperature in the semiconductor substrate process chamber is monitored while a constant current or voltage is supplied from a high-frequency power source to the discharge electrodes during plasma discharge an abrupt change in the impedance or temperature is detected, which is determined to be an end of cleaning.

FUNCTION

It has been confirmed that an abrupt change point of an impedance between the electrodes during cleaning or a temperature in the process chamber is an end of cleaning. The impedance or the temperature can be monitored with high precision during cleaning in a real time manner. Therefore, an end of cleaning can be determined with high precision, and the operation efficiency of the semiconductor manufacturing apparatus can be improved. In addition, since a stable plasma state can be obtained by supplying a constant current or voltage to the discharge electrodes during cleaning, the reproducibility of cleaning under the same conditions can be improved. As a result, the time required for cleaning can be shortened.

BRIEF DESCRIPTION OF DRAWINGS

FIG. 2 is a graph showing a relationship between the cleaning time, the voltage between electrodes, and an injected electrode current in the apparatus of FIG. 1;

FIG. 5 is a graph showing the relationship between the cleaning time and temperature in the chamber of the apparatus of FIG. 4.

BEST MODE OF CARRYING OUT THE INVENTION

An embodiment of the present invention will be described in detail with reference to the accompanying drawings.

Figure 1:
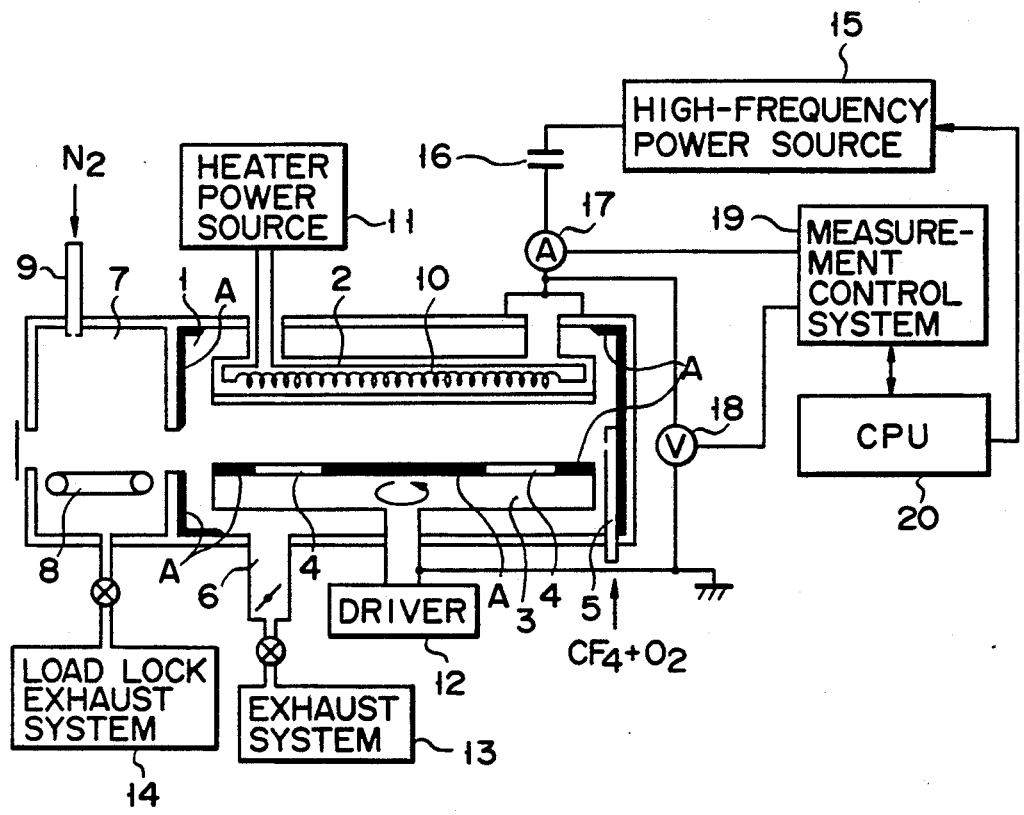
FIG. 1 is a view showing an arrangement of a plasma CVD apparatus of a parallel plate electrode type to which a method of determining an end of cleaning of a semiconductor manufacturing apparatus according to an embodiment of the present invention is applied.

In a plasma CVD apparatus of a parallel plate electrode type shown in FIG. 1, reference numeral 1 denotes a reaction chamber; 2, an upper electrode; 3, a lower electrode; 4, a table on which a semiconductor substrate is mounted; 5, a reactive gas (e.g., $CF_4+O_2$) feed path; 6, an exhaust port; 7, a load lock chamber; 8, a semiconductor substrate conveyor system; 9, an inactive gas (e.g., $N_2$) feed path; and 10, a heater which is incorporated in the apparatus to heat uppper electrode 2. Outside of chamber 1, the apparatus comprises heater power source 11 for energizing the heater, driving system 12 for rotating lower electrode 3, a reaction chamber exhaust system 13, load lock exhaust system 14, high-frequency power source 15 for generating a high-frequency power of, e.g., about 400 kHz, coupling capacitor 16 for supplying/coupling the high-frequency power to upper electrode 2, current detecting pickup 17 for detecting a current supplied from high-frequency power source 15 to upper electrode 2, voltage detecting pickup 18 for detecting a voltage between upper electrode 2 and lower electrode 3 (grounded), measurement control system 19 for measuring an impedance between upper and lower electrodes 2 and 3 on the basis of a detection output from pickup 17, CPU (central processing unit) 20 which is operated in accordance with a program so as to output an operation stop control signal to high-frequency power source 15 by determining an end of cleaning on the basis of a measurement result from measurement control system 19, and various gas supply sources (not shown).

High-frequency power source 15 incorporates a constant current control function for setting output currents to be constant. Reference symbol A denotes a CVD film to be cleaned, which is deposited on upper and lower electrodes 2 and 3, and side walls in reaction chamber 1 when a plasma CVD film (e.g., a silicon oxide film and a silicon nitride film) is deposited on a semiconductor substrate. When film A is deposited to a thickness of, e.g., 10 to 20 $\mu$m, film A must be removed to prevent generation of particles.

A method of performing cleaning in reaction chamber 1 by dry etching using plasma discharge in a state wherein a semiconductor substrate is removed from chamber 1 after a batch process of plasma CVD is performed several times in the above plasma CVD apparatus will be described below. While reaction chamber 1 is set at a predetermined high temperature and is decompressed, a reactive gas is fed into the chamber, and a high-frequency power is supplied to cause plasma discharge. A constant current is kept supplied from high-frequency power source 15 during this plasma discharge, and the impedance of power source 15 is kept matched with an impedance between the electrodes. The injected current supplied from power source 15 is detected by current detecting pickup 17, the voltage between th electrodes is detected by voltage detecting pickup 18, and the impedance between the electrodes is detected by measurement control system 19.

FIG. 2 shows an example of data which is obtained by actually measuring an injected current (constant current) and a voltage between the electrodes as a function of cleaning time from when the power source is turned on to start the plasma discharge. It is apparent from FIG. 2 that the voltage between the electrodes gradually decreases as the cleaning time elapses, drops abruptly from a certain time point (Q), and gradually decreases again from a certain time point (P).

In this case, when the above process was checked by also utilizing a known plasma emission spectrum analysis, or a sample semiconductor chip was arranged in reaction chamber 1 and an etched-off state of the CVD film on the chip surface was observed by using an microscope, it was found that the cleaning was completed at second time point P at which the voltage abruptly changed.

Since the injected current is constant, the impedance between the electrodes changes in the same manner as the voltage between the electrodes. Therefore, the second abrupt change point of the impedance P can be determined to be an end point of cleaning.

CPU 20 receives the measurement result from measurement control system 19, measures an elapsed time from the start time point of dry cleaning (time 0 in FIG. 2), determines the cleaning end point (P), and sets an overtime point (R) of, e.g., 20% of the measured time. CPU 20 performs a control function so as to stop an operation of high-frequency power source 15 when the overtime has elasped. Note that differential voltage value $|dv/dt|$ abruptly increases at point Q and abruptly decreases at point P in FIG. 2. The contents of a timer counter (not shown) are latched at the time point when value $|dv/dt|$ is abruptly decreased, and a value 1.2 times the latched contents can be detected as point R.

Examples of etching conditions during cleaning in a practical case are as follows: the reaction gas ratio of $CF_4$ to $O_2$ is 9:1; flow rates of the gases are 450 and 50 SCCM, respectively; the chamber pressure is 0.25 Torr; the chamber temperature is 300° C., and the plasma supply current is 4.0 A (constant).

According to the method of determining an end of cleaning in the above embodiment, since an injected current from the power source is kept constant during cleaning, and the power source impedance is not fixed, and can be matched with the impedance between the electrodes, the plasma state can be stabilized. Therefore, in comparsion with the conventional power measurement method, the variation in time required for cleaning under the same conditions can be reduced, and hence the required time can be shortened.

Figure 3:
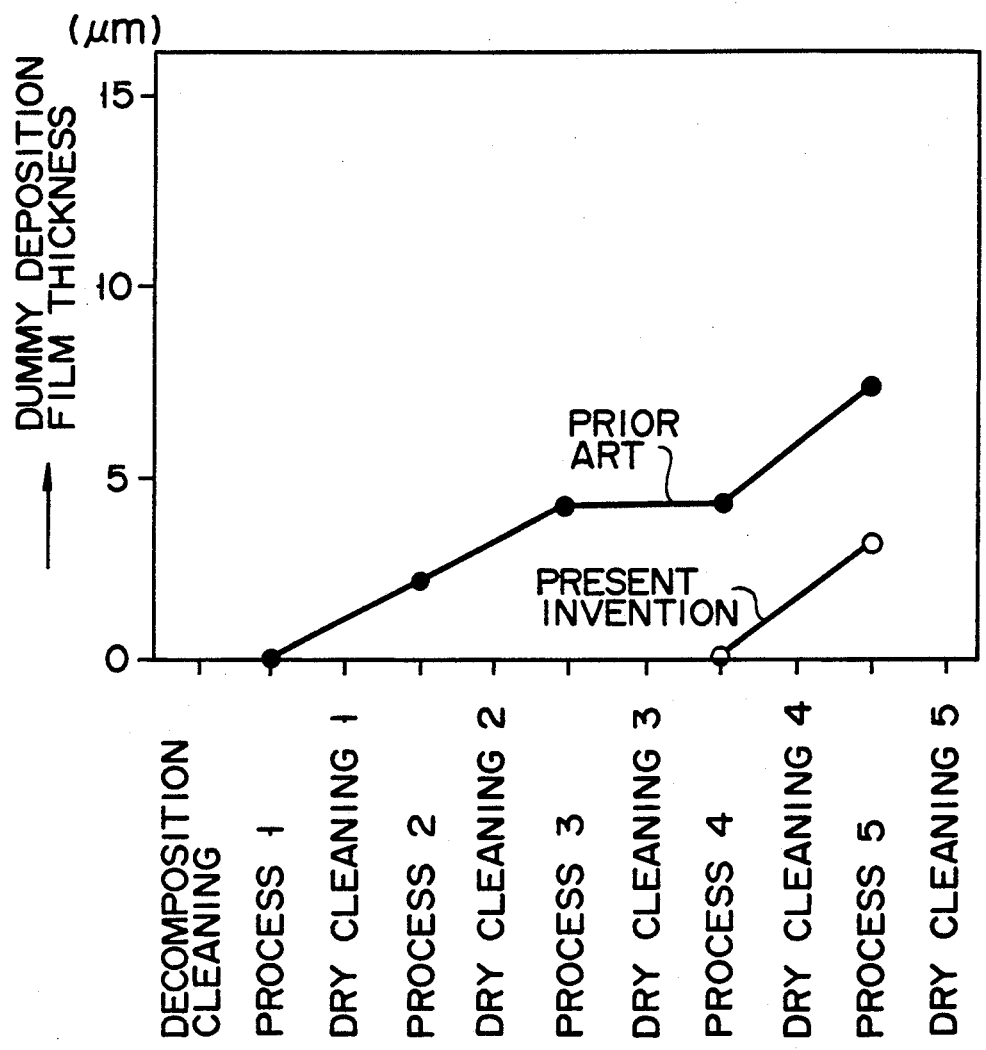
FIG. 3 is a graph showing the relationship between the number of cleaning operations and the thickness of film deposited on a dummy substrate by dummy deposition in a batch process when the method of the present invention is employed.

In addition, a change in impedance between the electrodes during cleaning is monitored in a real time manner, an abrupt change point of the impedance is detected, and the detection time point is determined to be an end of cleaning. Therefore, an end of cleaning can be determined with high precision. The operating efficiency of the plasma CVD apparatus can be improved and the throughput is increased as compared with the conventional time control method. An increase in throughput will be described in detail. As described above, since an end of cleaning can be accurately determined, the amount of overetching can be reduced to be as little as about 20%. For example, assume a time required to reach an end of cleaning is 700 minutes. In the conventional time control method, if an overetching time is set to 40% of the required time, 700 minutes×0.4=280 minutes are required. In the above embodiment, however, if an overetching time is set to 20% of the required time, 700 minutes×0.2=140 minutes are required, and hence a cleaning time including the overetching time is reduced by 15%. In addition, since the overetching time is short, formation of a carbon contamination layer on the electrode surface, due to $CF_4$ gas being used during cleaning, can be suppressed significantly to a small, and the state of the reaction chamber is relatively free from instability. Consequently, when, for example, dry cleaning is performed every 15 times a batch process for depositing a plasma silicon oxide film to a thickness of 1.0 μm upon formation of a 1.0-μm thick pre-deposition film is performed, and decomposition cleaning of the interior of the reaction chamber is performed every five times this dry cleaning is performed, the number of deposition processes (dummy deposition) on a dummy substrate, which are performed to obtain uniformity within ±5% of the thickness of the plasma silicon oxide film by stabilizing a state in the reaction chamber, can be decreased. That is, as shown in FIG. 3, unlike in the conventional time control method wherein dummy deposition must be performed after each dry cleaning from the first one, in the above embodiment, it is confirmed that dummy deposition is required to deposit a dummy deposition film to 3.0 μm only once after the fourth dry cleaning. It is apparent from this point that the throughput in the above embodiment can be increased as compared with the time control method.

In the above embodiment, the plasma CVD apparatus of the parallel plate electrode type is exemplified. When a tube type plasma CVD apparatus having a floating electrode is used, a current and a voltage which are intermittently applied are constant. In this case, plasma is generally controlled by a current application time so that an end of cleaning can be determined on the basis of an impedance change characteristic in the same manner as in the above embodiment by monitoring a relationship between an applied voltage and time integral current.

In addition, in the above embodiment, changes in impedance between the electrodes during cleaning due to plasma discharge are monitored. Instead of this, changes in the reaction chamber during cleaning may be monitored to determine an end of cleaning. For this purpose, as shown in a plasma CVD apparatus in FIG. 4, temperature sensor 41 such as a thermocouple is arranged near lower electrode 3, and an output from temperature sensor 41 when plasma discharge is performed by supplying a constant current under the same conditions as in the embodiment of FIG. 1 is measured by measurement control system 42. Then, CPU 43 receives this measurement result, determines a cleaning end point (P), and stops an operation of high-frequency power source 15 after a predetermined overetching operation.

Figure 4:
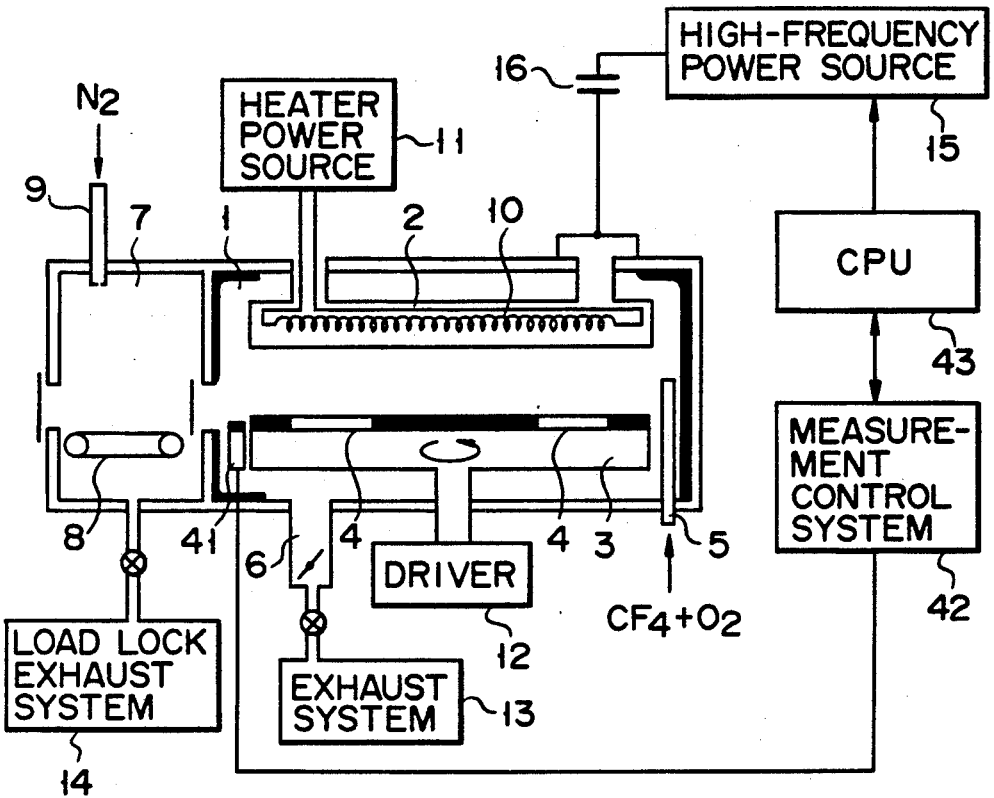
FIG. 4 is a view showing an arrangement of a plasma CVD apparatus to which a method according to another embodiment of the present invention is applied.

Note that the same reference numerals in FIG. 4 denote the same parts as in FIG. 1. Temperature sensor 41 preferably has a small heat capacity, and may be arranged on a portion of an electrode, a portion of the inner wall of the reaction chamber, or another portion to which an etched film is or is not adhered.

FIG. 5 shows an example of data obtained by actually measuring the temperature in the reaction chamber as a function of dry cleaning time. It is apparent from FIG. 5 that the temperature in the chamber rises as the cleaning time elapses, and drops abruptly at given time point P.

In this case, when this process was checked by a known plasma emission spectrum analysis or an etched-off state of a sample chip was observed, it was found that the cleaning process ended at point P at which the temperature reached a maximum value. However, point P at which the maximum value appears (an elapsed time from the start of cleaning) may deviate slightly from an actual end of etching because conduction and diffusion conditions of the heat in the reaction chamber vary depending on the states of plasma and reactive gas flow, and the shape of the chamber. In this case, if a program for causing CPU 43 to receive a measurement result while counting an elapsed time from the start of cleaning by using a timer or the like; determine cleaning end point P to set an overetching time of 10% or more (e.g., 20%) of the elapsed time at this point; and stop an operation of high-frequency power source 15 after the overetching time has elasped is loaded in CPU 43, the same effects as in the above embodiment can be obtained.

Note that the temperature in the chamber may take a minimum value at cleaning end point P depending on etching conditions and the type of film to be etched. In this case, an end point may be determined by detecting an abrupt change in temperature when the minimum value appears.

In addition, in each embodiment, a cleaning process in the plasma CVD apparatus is described. However, the present invention can be applied to other semiconductor manufacturing apparatuses (e.g., a low-pressure CVD apparatus and an oxide film sputtering apparatus) in which cleaning is performed by plasma discharge.

Moreover, in the above embodiments, a case wherein plasma discharge is caused by supplying a constant current from the high-frequency power source to the discharge electrode is described. However, the present invention can be applied to a case wherein plasma discharge is caused by applying a constant voltage in place of a constant current.

Effects of the Invention

As has been described above, according to the method of determining an end of cleaning of a semiconductor manufacturing apparatus of the present invention, an end of cleaning can be determined with high precision in a real time manner, and hence the time required for cleaning can be shortened, the operation efficiency of the semiconductor manufacturing apparatus can be improved, and other effects can be obtained.

We claim:

1. An improved method of determining an end of cleaning of a semiconductor manufacturing apparatus having a semiconductor substrate process chamber, comprising the steps of:

cleaning an interior of the chamber using plasma discharge etching;

monitoring a temperature in the chamber using a temperature sensor; and detecting the end of cleaning by detecting a transition in a rate of change of the monitored temperature.

2. A method according to claim 1, wherein in the end of cleaning occurs after a predetermined period of time has elapsed from the occurrence of the transition in the temperature change rate, said predetermined period of time resulting in overetching in the chamber.

* * * * *